United States Patent [19]
Matsui et al.

[11] Patent Number: 5,187,371
[45] Date of Patent: Feb. 16, 1993

[54] CHARGED PARTICLE BEAM APPARATUS

[75] Inventors: Hironobu Matsui, An Yang, Rep. of Korea; Mikio Ichihashi, Kodaira, Japan

[73] Assignee: Hitachi, Ltd., Tokyo, Japan

[21] Appl. No.: 686,922

[22] Filed: Apr. 18, 1991

[30] Foreign Application Priority Data

Apr. 19, 1990 [JP] Japan .................................. 2-101778
Apr. 19, 1990 [JP] Japan .................................. 2-101779
Apr. 27, 1990 [JP] Japan .................................. 2-110116

[51] Int. Cl.⁵ ............................................... H01J 3/10
[52] U.S. Cl. .................................. 250/396 R; 250/398
[58] Field of Search .................. 250/396 R, 397, 398; 313/414, 361.1

[56] References Cited

U.S. PATENT DOCUMENTS

| | | | |
|---|---|---|---|
| 3,614,520 | 10/1971 | Coleman | 250/396 R |
| 4,059,783 | 11/1977 | Nakaizumi et al. | |
| 4,389,571 | 6/1983 | Crewe | |
| 4,551,599 | 11/1985 | Liebl | 250/396 R |
| 4,556,798 | 12/1985 | McKenna et al. | 250/396 R |
| 4,663,525 | 5/1987 | Ohtsuki et al. | 250/396 R |
| 4,710,632 | 12/1987 | Ishitani et al. | 250/396 R |
| 4,725,736 | 2/1988 | Crewe | 250/396 R |
| 4,785,176 | 11/1988 | Frosien et al. | 250/396 R |
| 4,831,266 | 5/1989 | Frosien et al. | 250/397 |
| 4,896,036 | 1/1990 | Rose et al. | 250/397 |
| 4,926,054 | 5/1990 | Frosien | 250/397 |
| 4,963,748 | 10/1990 | Szilagyi | 250/396 R |
| 5,061,856 | 10/1991 | Frosien | 250/397 |

FOREIGN PATENT DOCUMENTS

| | | |
|---|---|---|
| 150941 | 8/1985 | European Pat. Off. . |
| 63-160144 | 7/1988 | Japan . |
| 63-252347 | 10/1988 | Japan . |
| 63-67743 | 12/1988 | Japan . |

*Primary Examiner*—Bruce C. Anderson
*Attorney, Agent, or Firm*—Fay, Sharpe, Beall, Fagan, Minnich & McKee

[57] ABSTRACT

A charged particle beam apparatus includes at least a charged particle source and an objective lens for converging onto a sample a charged particle beam emitted by the charged particle source. The objective lens is an electrostatic objective lens constituted by a first and a second electrode positioned opposite to each other and having openings through which the charged particle beam passes. The first electrode and the second electrode are located close to the charged particle source and to the sample, respectively. The first electrode is supplied with a positive potential as opposed to the second electrode when the charged particle beam is a negatively charged particle beam. Conversely, the first electrode is supplied with a negative potential as opposed to the second electrode when the charged particle beam is a positively charged particle beam. The principal plane of the electrostatic objective lens is located on the side of the sample below the bottom plane of the second electrode. This constitution allows the apparatus to be very small in size and to provide high resolution for observation.

50 Claims, 7 Drawing Sheets

CHARGED PARTICLE BEAM APPARATUS

BACKGROUND OF THE INVENTION:

The present invention relates to improvements in the electron microscope, electron beam lithography apparatus, ion microscope, secondary ion mass spectrometer or similar charged particle beam apparatus employing a finely converged electron or ion beam. Still more particularly, the invention relates to structural improvements in a charged particle beam optical system associated with the charged particle beam apparatus.

Conventionally, the charged particle beam optical system used in the above-mentioned charged particle beam apparatus utilizes as its objective lens a magnetic lens made of a yoke 14 and an exciting coil 15 (FIGS. 4 and 12), or an Einzel lens constituted by three electrodes (FIGS. 5 and 13). The objective lens is used to converge a charged particle beam on a sample. (Some aspects of the magnetic lens and the Einzel lens are illustratively disclosed in Japanese Patent Laid-Open Nos. 63-160144 and 63-252347, respectively.)

A charged particle beam generator in the charged particle beam apparatus generally comprises an electrostatic lens that draws a charged particle beam from a charged particle source and accelerates (or decelerates) the beam with a predetermined level of energy for convergence onto an object. The electrostatic lens is illustratively constituted by a three-electrode lens containing three electrodes 19, 20 and 21 in FIGS. 12 and 13. The electrostatic lens and objective lens in the charged particle beam generator for beam convergence need to be optically aligned by mechanical or electrical alignment means. A typical prior art electrical alignment means for precise optical axis alignment of the charged particle beam allows the axial displacement between lenses to be corrected by an alignment coil 23' in a space of ground potential, e.g., between the three-electrode lens and the magnetic lens of FIG. 12, or between the three-electrode lens and the Einzel lens of FIG. 13. The charged particle beam is deflected and the astigmatism correction thereof achieved using a deflecting coil 5' and a stigma coil 24' in a space of ground potential under the electrostatic lens (i.e., on the sample side) constituting the charged particle beam generator. (This aspect of the charged particle beam apparatus is illustratively disclosed in Japanese Patent Laid-Open No. 63-67743.)

The charged particle beam apparatus such as the electron microscope utilizes a finely converged charged particle beam for observation of the sample surface. With such apparatus, what primarily determines the performance thereof (e.g., resolution) is the spot diameter of the charged particle beam converged by the objective lens onto the sample. How small the spot diameter can be depends on how the optical aberration of the objective lens is minimized. To minimize the optical aberration of the objective lens requires positioning the sample as close to the principal plane of the objective lens as possible so that the focal distance of the objective lens will be minimized. As shown in FIG. 4, the conventional magnetic lens has its principal plane 11 located in a magnetic field within a gap H of the yoke 14. Therefore, to position a sample 6 close to the principal plane 11 requires putting the sample 6 somehow into the narrow gap H of the yoke 14. This can be a major constraint on sample location where a sample with a large surface area is to be observed or where the same sample is to be observed or measured concurrently by other observing or measuring instruments connected to the charged particle beam apparatus. And as depicted in FIG. 5, the conventional Einzel lens has the principal plane 11 thereof always located therewithin regardless of a positive or negative voltage being applied to the center electrode thereof. This prevents the sample 6 from getting placed sufficiently close to the principal plane 11 of the lens. The structural constraint necessarily promotes the optical aberration of the lens.

Where the conventional charged particle beam apparatus uses an electrostatic lens or the combination of an electrostatic lens with a magnetic lens to converge a charged particle beam onto a sample, it is important to minimize the optical aberration involved so as to produce a beam spot with the lowest defocusing value on the sample surface. On the electrostatic lens, the axial displacement between electrodes is a major factor that increases the optical aberration. Since there are limits to the precision in machining and assembling the electrodes, there is no avoiding some degree of inter-electrode axis displacement. Conventionally, the axial displacement between the lenses constituting the charged particle beam apparatus (i.e., between electrostatic and magnetic lens or between two electrostatic lenses) is corrected using an electrical means. That is, the electrical means aligns the charged particle beam within the space of ground potential between the lenses. Conventionally, however, the axial displacement of the electrodes constituting the electrostatic lens is not precisely corrected by the electrical means. Typically, the electrodes of the electrostatic lens are mechanically adjusted from outside the apparatus (i.e., from the atmospheric pressure side) for axial alignment. But problems remain with the precision of mechanical adjustment and the repeatability thereof for a number of reasons. One reason is a complicated apparatus structure necessitated by insulation of the voltage applied to the electrodes as well as by sealing of the vacuum space. Another reason for the above problems is the mechanical backlash that remains.

To minimize chromatic aberration and spherical aberration requires positioning the lens as close to the sample as possible. This requirement is conventionally met by installing a charged particle beam deflection means or an astigmatism correction means under (i.e., on the sample side) the electrostatic lens (e.g., three-electrode lens) constituting the charged particle beam generator. Because this structure prevents the sample from getting positioned sufficiently close to the electrostatic lens which is part of the charged particle beam generator, it is necessary to provide another objective lens under the electrostatic lens. The result is a very complicated electronic optical system that keeps the charged particle beam apparatus from being manufactured small.

SUMMARY OF THE INVENTION

It is therefore an object of the present invention to provide a charged particle beam apparatus which is very small and simply structured and which, with a sample positioned outside the objective lens, still makes the optical aberration sufficiently small.

It is another object of the present invention to provide a charged particle beam apparatus which minimizes the optical aberration stemming from the axial displacement between electrodes constituting the electrostatic lens of the apparatus.

It is a further object of the present invention to provide a charged particle beam apparatus whose charged particle optical system is so simply designed and structured that the apparatus is manufactured smaller than ever.

In carrying out the invention and according to a first aspect thereof, there is provided a charged particle beam apparatus having as its objective lens an electrostatic lens made of a first and a second electrode, wherein each electrode contains an opening through which a charged particle beam is allowed to pass. The first electrode is closer to a charged particle source, while the second electrode is positioned opposite to the first electrode and on the sample side. The first electrode is further held at a positive or negative potential if the charged particle beam is negatively or positively charged, respectively, so that the charged particle beam will be converged. The principal plane of the electrostatic lens is located closer to the sample than to the bottom surface of the second electrode.

According to a second aspect of the invention, there is provided a charged particle beam apparatus comprising a charged particle beam deflection means for deflecting the charged particle beam, for the purpose of scanning a sample surface thereby, within a space held at the potential of the same polarity as the first electrode as opposed to the second electrode and, more typically, within a space held at the same potential as the first electrode.

According to a third aspect of the invention, there is provided a charged particle beam apparatus comprising an electromagnetic or electrostatic alignment means for aligning the charged particle beam within an internal space of an electrode among those constituting an electrostatic lens for converging the charged particle beam, the electrode being supplied with a variable voltage that maximizes the velocity of the charged particle beam.

According to a fourth aspect of the invention, there is provided a charged particle beam apparatus comprising an electromagnetic or electrostatic charged particle beam deflection means for scanning the charged particle beam two-dimensionally within the same intra-electrode space as that for aligning the charged particle beam.

According to a fifth aspect of the invention, there is provided a charged particle beam apparatus comprising an electromagnetic or electrostatic astigmatism correction means for astigmatism correction of the charged particle beam within the same intra-electrode space as that for aligning the charged particle beam.

The above-described aspects of the invention offer a number of advantages. One advantage stems from the positioning of the principal plane of the electrostatic objective lens under two electrodes constituting the lens, i.e., between the second electrode and the sample. This arrangement allows the focal distance to be sufficiently short even when the sample is placed not within the objective lens but under the second electrode (i.e., on the sample side). That is, only a very low level of lens aberration is involved. A charged particle beam apparatus incorporating this arrangement permits observation of a sample with a large surface area at high resolution, the sample being placed as is (i.e., not divided into smaller pieces) under the objective lens. Another advantage of the invention stems from the simply structured two-electrode electrostatic lens used as the objective lens. This allows the whole charged particle beam apparatus to be manufactured smaller. A further advantage of the invention is a free space made available between the objective lens and the sample thanks to the above structure, the sample being observed at high resolution at a certain distance away from the objective lens. This free space is utilized by other observing or measuring instruments connected to the charged particle beam apparatus for extended observation and measurement.

Because the objective lens according to the invention comprises the means for deflecting the charged particle beam within the space of the electrodes constituting the lens, the electronic optical system of the charged particle beam apparatus is compactly structured.

Because the electrostatic lens according to the invention comprises the means for aligning the charged particle beam within the space of the electrodes constituting the lens, the inter-electrode axial displacement is precisely corrected. This arrangement effectively lowers the aberration of the electronic optical system in the charged particle beam apparatus. For the charged particle beam to be aligned, deflected or corrected in terms of astigmatism within the internal space of the electrostatic lens, the means for alignment, deflection and astigmatism correction are compactly installed close to the lens. This arrangement makes it easier to reduce the whole structure size of the electronic optical system in the charged particle beam apparatus.

DESCRIPTION OF PREFERRED EMBODIMENTS

Preferred embodiments of the present invention will now be described in detail with reference to the accompanying drawings. Although the description that follows deals primarily with devices using a converged electron beam, especially with scan type electron microscopes, these devices are not limitative of the invention. It is to be noted that the invention may also be applied to devices employing a converged ion beam.

Figure 1:
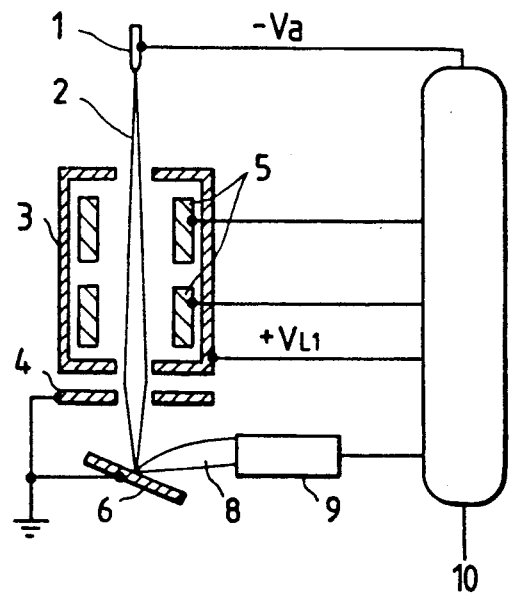
FIG. 1 is a schematic cross-sectional view of a scan type charged particle beam apparatus practiced as a first embodiment of the present invention.

FIG. 1 is a schematic cross-sectional view of a scan type charged particle beam apparatus practiced as the first embodiment of the present invention, showing its electronic optical system in particular. In FIG. 1, an electron beam 2 emanated from an electron source 1 is finely converged onto a sample 6 by an objective lens constituted by two electrodes 3 and 4. Of the two electrodes 3 and 4, the first electrode 3 on the side of the electron source 1 bears a positive voltage, as opposed to the second electrode 4 (held at the ground voltage) on the side of the sample 6. The positive voltage is adjusted so as to regulate the electrical field between the first and the second electrodes 3 and 4. This in turn adjusts the lens action of the objective lens. In this manner, a principal plane 11 of the objective lens is formed under the second electrode 4. Surrounded by the first electrode 3, the electron beam 2 is deflected by an electrostatic or magnetic deflector 5 within a space that is held at the same potential as the first electrode 3. This causes the electron beam 2 to scan the sample 6 two-dimensionally. Secondary electrons emanating from the sample 6 under irradiation of the electron beam 2 are detected by a secondary electron detector 9. A signal resulting from the secondary electron detection is given as an image signal to a control and display apparatus 10 whose display unit shows a two-dimensional secondary electron image of the sample 6. All operations related to these controls, signal processing and image display are performed by the control and display apparatus 10.

The above sentence that says "the electron beam 2 is deflected within a space that is held at the same potential as the first electrode 3" should be interpreted as follows: What is designated here is the position of the space in which the electron beam 2 is deflected (i.e., deflecting space), not the position of the space in which to install the deflector (e.g., deflecting coil or electrode). Furthermore, the deflecting space is not limited to the space surrounded by the first electrode 3; it may be a space, as will be described later in more detail, adjacent to the first electrode 3 and held at the same potential thereof. The deflecting space may also be a space adjacent to the first electrode 3 and held at the potential of the same polarity thereof (i.e., positive potential as opposed to the second electrode 4).

Figure 6:
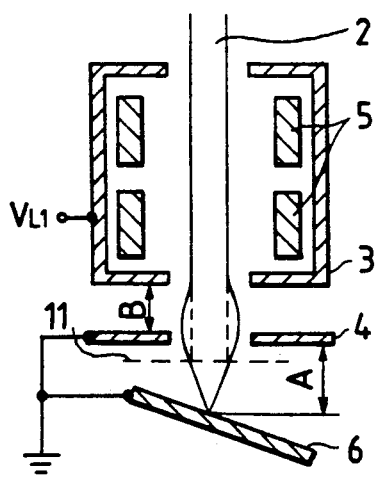
FIG. 6 is a schematic cross-sectional view of the principal plane of the electrostatic objective lens according to the invention, indicating the position of the principal plane thereof.

FIG. 6 schematically shows how the electron beam 2 plots its trajectory when one of the two electrodes (i.e., first electrode 3) constituting the above-described electrostatic objective lens is held at a positive potential as opposed to the second electrode 4. The electron beam 2 is diverged when moving past the first electrode 3 and then acutely converged near the second electrode 4. This means that a principal plane 11 of the lens is located under the electrode 4 and towards the sample 6. As a result, with the sample 6 placed outside (i.e., under) the lens, the sample 6 may be positioned sufficiently close to the principal plane 11 of the lens for observation. This arrangement significantly reduces the lens aberration involved. However, if the first electrode 3 were held at a negative potential as opposed to the second electrode 4, the principal plane of the lens would be located far above the bottom of the first electrode 3, and the lens aberration would be much greater. That is, for the electrostatic lens to operate as the objective lens using the electron beam requires holding the first electrode 3 at a positive potential as opposed to the second electrode 4. (Needless to say, for the electrostatic lens to operate as the objective lens using an ion beam requires holding the first electrode 3 at a negative potential as opposed to the second electrode 4.)

Figure 4:
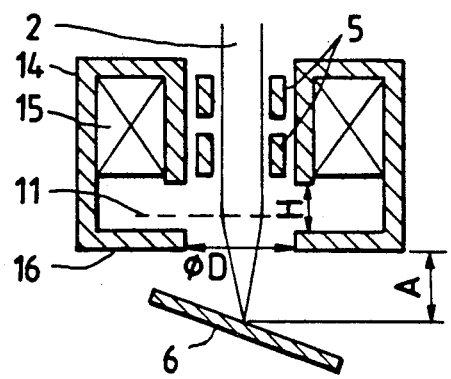
FIG. 4 is a schematic cross-sectional view of a conventional magnetic objective lens.

The conventional magnetic objective lens, by contrast, has its principal plane 11 always positioned within a gap of the yoke 14, as shown in FIG. 4. This is because the electron beam 2 is subjected to the convergence action only within that gap. With the principal plane 11 of the magnetic objective lens always located above the lower surface 16 of the yoke 14, there is a limit to the approaching distance between the sample 6 and the principal plane 11 of the lens as long as the sample 6 is placed outside (i.e., under) the lens. This in turn places constraints on the measures to reduce the lens aberration involved.

Figure 7:
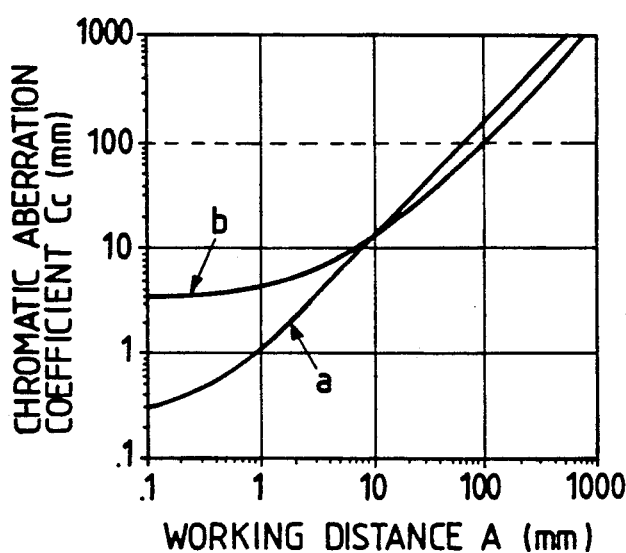
FIG. 7 is a view graphically comparing in terms of aberration the conventional magnetic objective lens with the electrostatic objective lens according to the invention.

FIG. 7 is a view graphically comparing the typical conventional magnetic objective lens with the electrostatic objective lens according to the invention in terms of how a working distance A (i.e., distance between lower surface 16 of lens and sample 6) is related to a chromatic aberration coefficient Cc. The pole piece of the conventional magnetic objective lens illustratively measures 4 mm in gap (H) and 3 mm in opening diameter ($\phi$D). The electrostatic objective lens according to the invention measures 2 mm (B) between the first and the second electrodes 3 and 4. With the conventional magnetic lens, the aberration thereof is not appreciably reduced by shortening the working distance A, i.e., the distance between the sample and the lower surface of the lens, as indicated by the curve b of FIG. 7. With the electrostatic objective lens according to the invention, by contrast, the aberration thereof is lowered proportionately by shortening the working distance, i.e., the distance between the sample and the principal plane 11 of the lens, as illustrated by the curve a of FIG. 7. In this respect, the electrostatic objective lens according to the invention works better than the conventional magnetic objective lens in improving the scan type electron beam apparatus.

One conventional way to reduce the lens aberration of the electron beam apparatus using the magnetic lens is to place the sample within the gap formed by the lens. However, this prior art arrangement is not convenient where it is desired to observe under the electron microscope a sample with a large surface area (e.g., semiconductor wafer) without dividing it into pieces, or where the electron microscope needs to be connected to other observing or measuring instruments for complex and extended observation or measurement. By contrast, the electron beam apparatus employing the electrostatic objective lens according to the invention allows samples, even those with large areas, to be observed undivided and positioned away from the lens without impairing the resolution. The novel electrostatic lens arrangement also makes it easy to connect the electron beam apparatus to other observing or measuring instruments through the use of the space between the sample and the lens.

Figure 5:
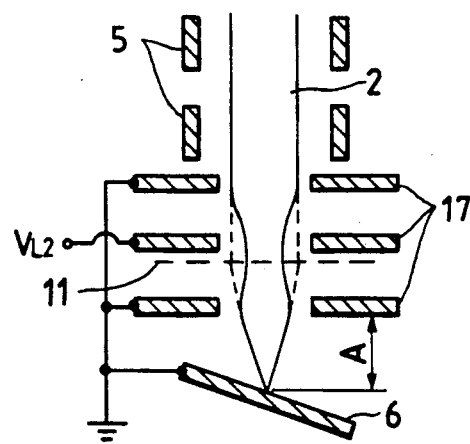
FIG. 5 is a schematic cross-sectional view of a conventional Einzel electrostatic objective lens.

Unlike the prior art magnetic lens, the electrostatic objective lens according to the invention has no need to be equipped with an exciting coil. This means that the lens can be made very small. For example, conventional magnetic lenses measure approximately 100 to 150 mm in diameter each, compared with the electrostatic objective lens according to the invention which readily measures less than 10 mm in diameter. The fact that the electrostatic objective lens is made very small proves to be another improvement over the conventional magnetic lens. In this respect, too, the novel electrostatic objective lens makes it more convenient for the electron beam apparatus to be connected to other observing or measuring instruments.

Where a conventional Einzel objective lens 17 in FIG. 5 is used, its principal plane 11 always exists within the internal space of the lens 17 regardless of the status of the voltage being applied to its center electrode. More specifically, in the electron beam apparatus employing the Einzel objective lens, the electron beam 2 is deflected with the same potential as the sample 6, i.e., with the ground potential. This means that the upper and lower electrodes on both sides bear the same ground potential. Thus the same magnitude of lens action develops not only under the center electrode but also thereabove. The presence of the upper lens action causes the principal plane 11 of the Einzel lens 17 to be located approximately at the lens center. This prevents the sample 6 from getting positioned sufficiently close to the principal plane 11, with the result that the lens aberration is greater than that of the conventional magnetic lens. In order to locate the principal plane 11 of the lens as close to the sample 6 as possible, the electron beam 2 should preferably be deflected, as with the invention, inside a space having the same potential as the first electrode 3, or at least inside a space having the potential of the same polarity as the first electrode 3. This arrangement is needed to keep the strong lens action from developing immediately above the first electrode 3. Furthermore, the Einzel objective lens has more electrodes and is more complicated in structure than the electrostatic objective lens according to the invention. In these respects, the electron beam apparatus using the electrostatic objective lens according to the invention is a significant improvement over its counterpart employing the conventional Einzel objective lens 17.

Figure 2:
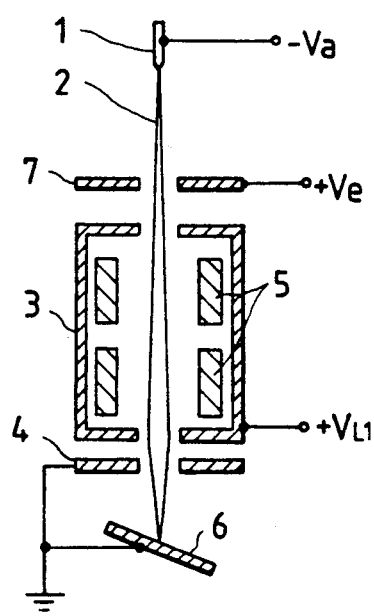
FIG. 2 is a schematic cross-sectional view of a scan type charged particle beam apparatus practiced as a second embodiment of the invention.

FIG. 2 is a schematic cross-sectional view of a scan type electron microscope practiced as the second embodiment of the invention, specifically depicting its electronic optical system. The second embodiment utilizes as its electron source 1 a field emission type electron source and a drawing electrode 7 that controls the emission current therefrom. Using the field emission type electron source permits observation with higher resolution at lower levels of acceleration. To stabilize the emission current requires using the field emission electron source in an ultra-high vacuum at $10^{-10}$ Torr or thereabout. The use of the electrostatic lens as per the invention instead of the conventional magnetic lens permits degassing through high-temperature baking, which makes it easier to attain an ultra-high vacuum state.

Figure 3:
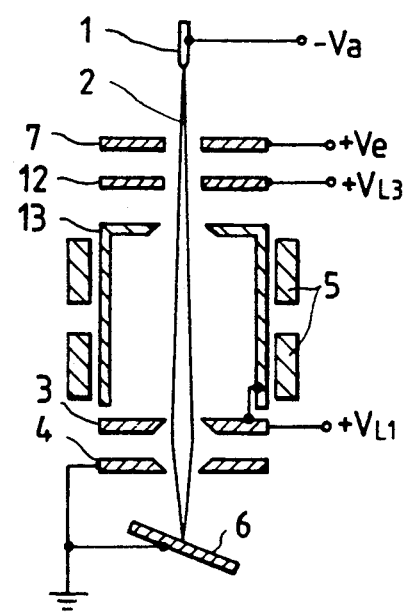
FIG. 3 is a schematic cross-sectional view of a scan type charged particle beam apparatus practiced as a third embodiment of the invention.

FIG. 3 is a schematic cross-sectional view of a scan type electron microscope practiced as the third embodiment of the invention, illustrating its electronic optical system in particular. In addition to the components of the second embodiment in FIG. 2, the third embodiment comprises a probe current control electrode 12 under the drawing electrode 7. Adjusting the voltage applied to the electrode 12 provides control over the current value (i.e., probe current) of the electron beam 2 irradiated at the sample 6.

In order to provide a space in which to deflect the electron beam 2 (the space having the same potential as the first electrode 3), another electrode 13 (deflecting space forming electrode) 13 may be furnished above the first electrode 3, the electrode 13 being connected to the first electrode 3 so that both electrodes will bear the same potential. If an electromagnetic deflecting coil is used as the deflector 5, the electrode 13 may be made of a nonmagnetic material so that the electromagnetic deflecting coil 5 will be located outside the electrode 13. With the scan type electron microscope practiced as the third embodiment, a resolution level of as high as 8 nm was confirmed during observation of a sample surface at a low acceleration voltage of about 1 kV.

Figure 8:
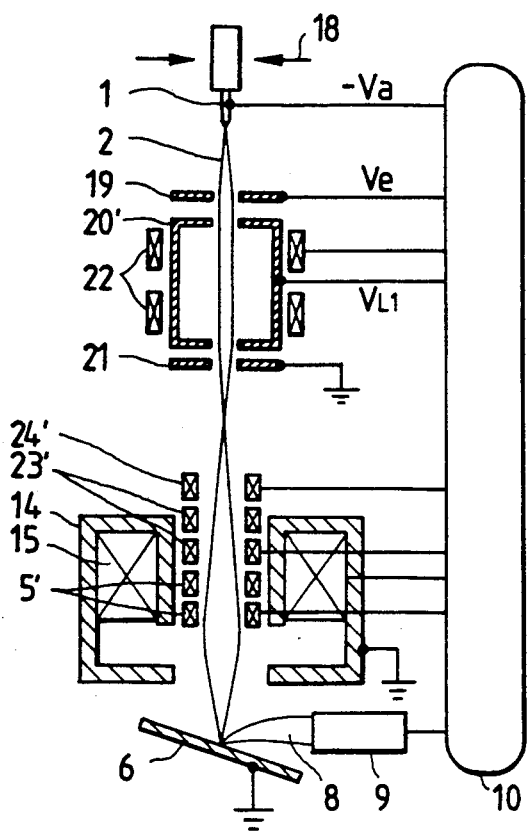
FIG. 8 is a schematic cross-sectional view of a scan type electron microscope practiced as a fourth embodiment of the invention.

FIG. 8 is a schematic cross-sectional view of a scan type electron microscope practiced as the fourth embodiment of the invention, showing its electronic optical system in particular. In FIG. 8, the electric field between the field emission electron source 1 and the first electrode 19 causes the electron beam 2 to be emitted from the source 1. The electron beam 2 is then converged by two electric fields, one between the first electrode 19 and a second electrode 20', and the other between the second electrode 20' and a third electrode 21. Thereafter, the electron beam 2 is focused onto the sample 6 by the magnetic lens made of the yoke 14 and the exciting coil 15, the beam being made to scan the sample surface two-dimensionally by a deflecting coil 5'. Secondary electrons 8 emanated from the sample 6 are detected by the secondary electron detector 9. A signal resulting from the secondary electron detection is given as an image signal to the control and display apparatus 10 whose display unit shows a two-dimensional secondary electron image of the surface of the sample 6. In this setup, the axial displacement between the electron source 1 and the electrodes 19, 20' and 21 constituting the three-electrode electrostatic lens is corrected through mechanical and magnetic alignment. That is, the electron source 1 is mechanically aligned by a moving mechanism 18, and the electron beam 2 is magnetically aligned by a first alignment coil 22 inside the electrostatic lens (i.e., within the space enclosed by the second electrode 20'). The electron beam 2 is aligned further by a conventional second alignment coil 23' that compensates for any inter-lens axial displacement so that the electron beam 2 will pass through the center of the magnetic lens 14. The stigma coil 24' provides astigmatism correction. All operations related to these controls, signal processing and image display are performed by the control and display apparatus 10.

Figure 12:
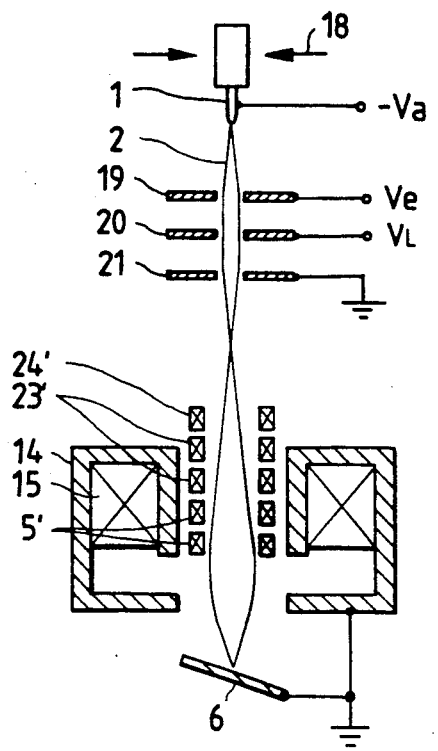
FIG. 12 is a schematic cross-sectional view of one conventional scan type electron microscope.
Figure 13:
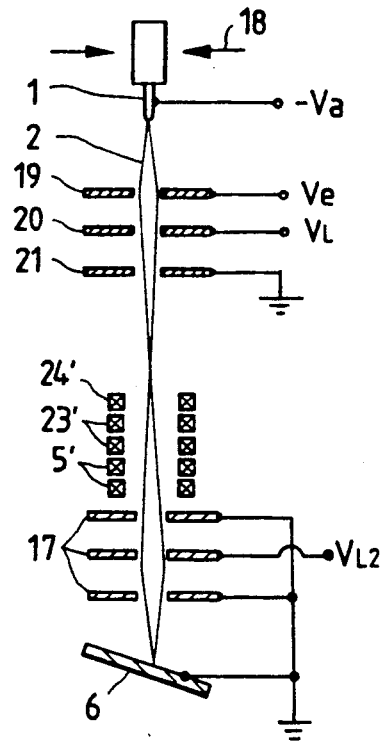
FIG. 13 is a schematic cross-sectional view of another conventional scan type electron microscope.

Conventionally, as shown in FIG. 12 or 13, there are provided only the mechanical alignment mechanism 18 and the second alignment coil 23'. The mechanical alignment mechanism 18 fine-tunes the position of the electron source 1. The second alignment coil 23' corrects aberrations resulting from the axial displacement between the three-electrode electrostatic lens made of the anodes 19, 20 and 21 on the one hand, and the magnetic lens 14 or Einzel lens 17 on the other. However, the conventional setup does not include an alignment means for correcting the axial displacement across the anodes 19, 20 and 21 constituting the three-electrode electrostatic lens. For this reason, it is impossible for the conventional setup to correct with sufficient precision the errors that may arise from machining or assembling the electrodes.

Figure 14:
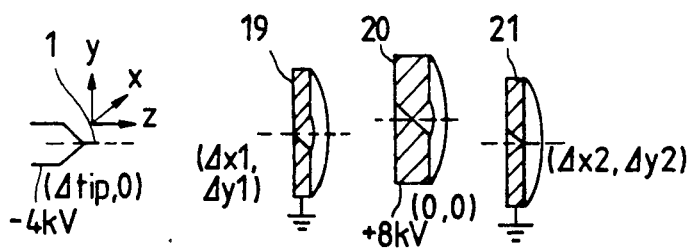
FIG. 14A–B is a set of views illustrating how the defocusing value of an electron beam spot diameter develops due to the axial displacement between lens electrodes in a conventional setup.
Figure 14:
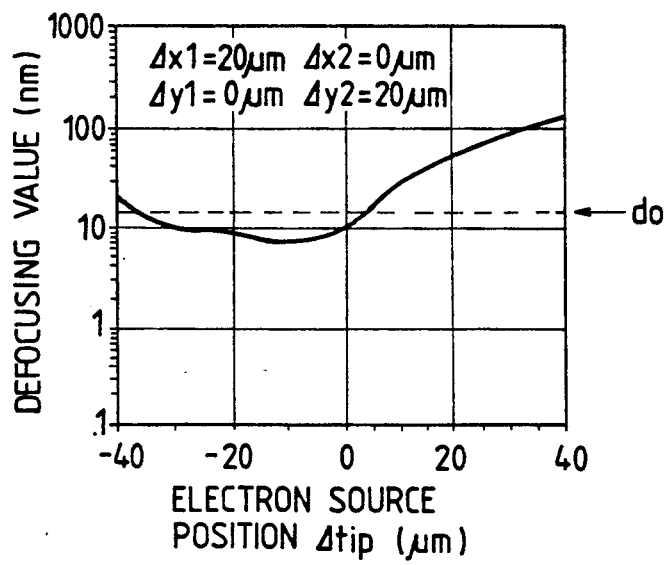

Referring to FIG. 14, there will now be described why the prior art mechanical alignment means is not sufficient for correcting the lens aberration. FIG. 14 A-B graphically plots two kinds of typical spot diamters with defocusing values, one diameter ($d_0$) being calculated with no axial displacement assumed to exist across the electrodes of a three-electrode electrostatic lens focusing an electron beam, the other diameter being computed with the three electrodes illustratively having a displacement of 20 μm each. It is assumed here that the second anode 20 is supplied with a positive potential so as to minimize the chromatic and spherical aberration of the three-electrode electrostatic lens, thereby focusing the electron beam 2. As shown in FIG. 14, no matter how aligned the electron beam 2 may be, the defocusing values of the spot diameter remain at least as large as the spot diameter ($d_0$) ideally with no axial displacement; smaller and more satisfactory spot diameters cannot be obtained. The reason for this will be explained with reference to FIG. 15.

Figure 15:
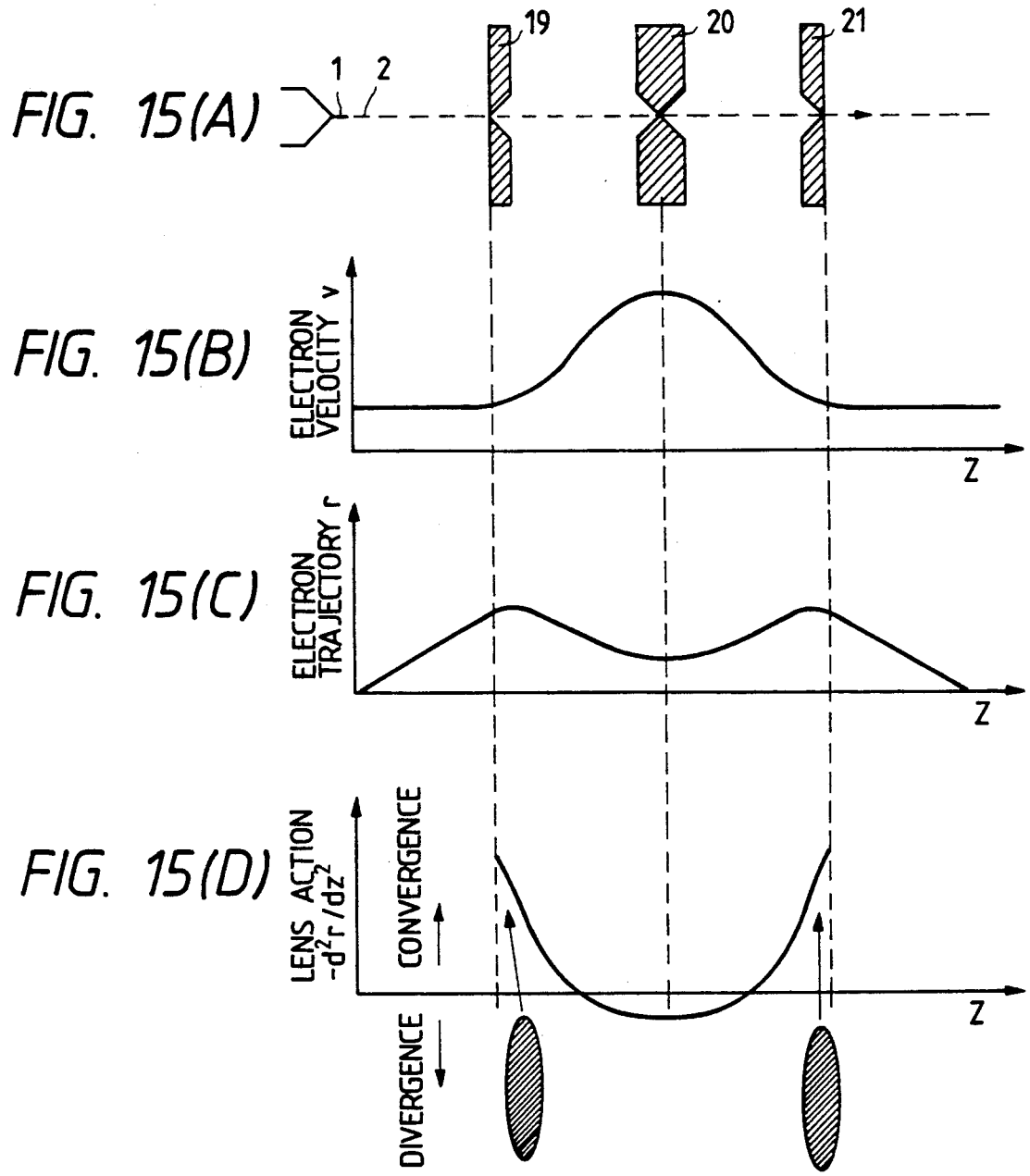
FIG. 15A-D is a set of views depicting how electron velocity develops, electron trajectory occurs and lens action takes place typically in connection with an electrostatic lens setup.

FIG. 15 A-D is a set of views depicting how electron velocity develops, electron trajectory occurs and lens action takes place typically in connection with a three-electrode electrostatic lens setup. As illustrated in FIG. 15, near the second anode 20 where the electron velocity is the highest, the converging action of the lens is weak. The converging action (i.e., convex lens action) is the strongest at two locations, one near the first anode 19 and the other near the third anode 21. Thus, to minimize the defocusing value stemming from the axial displacement across the lens electrodes requires routing the electron beam through the center axis of the two locations where the converging action is the strongest, i.e., through the center axis of the openings of the first and the third anodes 19 and 21. With the conventional three-electrode electrostatic lens setup shown in FIGS. 12 and 13, it is impossible to meet the above requirements no matter how well the electron source 1 may be mechanically fine-tuned. That is why those defocusing values of the spot diameter which result from the axial displacement across electrodes are very difficult to reduce.

With the fourth embodiment of the invention, the second anode 20', close to which the lens action is the weakest and the velocity of the electron beam 2 is the highest, is expanded in the optical axis direction to make more space inside. The embodiment is then additionally equipped with the first alignment coil 22 that electromagnetically aligns the electron beam 2 within the expanded space of the second anode 20'. By providing both mechanical alignment of the electron source 1 and electromagnetic alignment of the electron beam 2 using the first alignment coil 22, the above arrangement makes it possible to route the electron beam 2 through the center axis of the openings of the first and third anodes 19 and 21. Given such alignment means, the spot diameter defocusing values due to the axis displacement across electrodes are made smaller by one order of magnitude than those plotted in solid line in FIG. 14. Although FIGS. 14 and 15 depict characteristics of typical electrostatic lens setups comprising three electrodes each, the number of the component electrodes generally does not matter when it comes to what kind of lens action occurs where in the electrostatic lens setup. That is, the converging action within the lens space is the strongest and is the weakest where the velocity of the charged particle beam is the lowest and is the highest, respectively. It follows that the optical aberration resulting from the axial displacement across electrodes is most effectively corrected if the charged particle beam is aligned at the location where the velocity of the beam is the highest.

Figure 9:
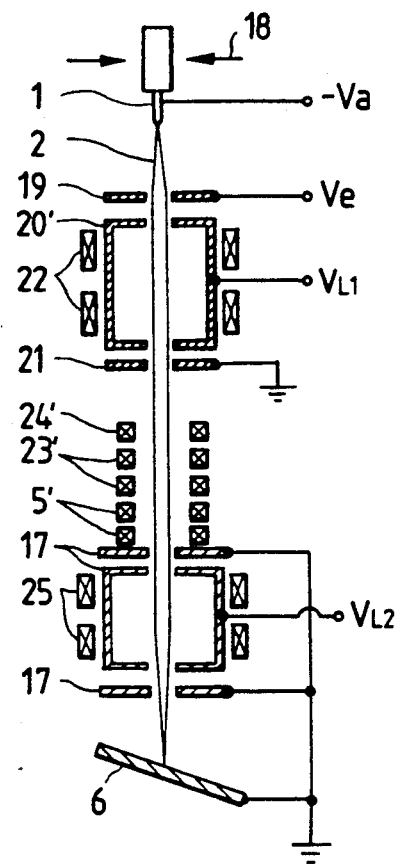
FIG. 9 is a schematic cross-sectional view of a scan type electron microscope practiced as a fifth embodiment of the invention.

FIG. 9 is a schematic cross-sectional view of a scan type electron microscope practiced as the fifth embodiment of the invention. The fifth embodiment uses the Einzel lens 17 as its objective lens. This embodiment is structured so that the velocity of the electron beam is the highest not only near the second anode 20' of the three-electrode electrostatic lens in the above-described electron beam generator, but also close to the center electrode of the Einzel lens 17. In addition to the first alignment coil 22 for the three-electrode electrostatic lens and the second alignment coil 23' for inter-lens axial alignment (with the embodiment of FIG. 8), the fifth embodiment is equipped with a third alignment coil 25 for use with the Einzel lens (electrostatic lens) 17. The third alignment coil 25 corrects adverse effects of the axial displacement across the electrodes of the Einzel lens 17 more effectively than the conventional setup of FIG. 13.

Figure 10:
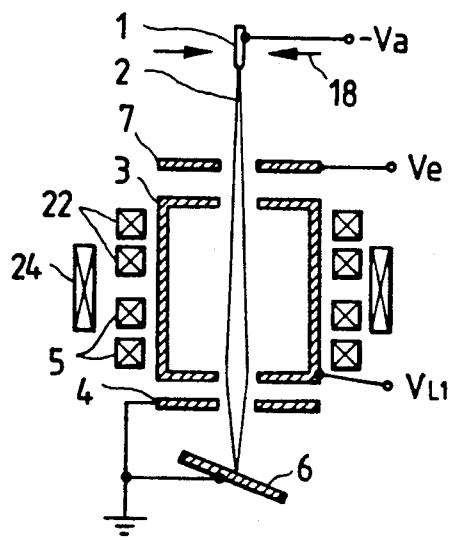
FIG. 10 is a schematic cross-sectional view of a scan type electron microscope practiced as a sixth embodiment of the invention.

FIG. 10 is a schematic cross-sectional view of a scan type electron microscope practiced as the sixth embodiment of the invention. With this embodiment, the electron beam 2 is drawn from the electron source 1 by the drawing electrode 7 and is focused directly onto the sample 6 by a two-electrode electrostatic objective lens according to the invention. The sixth embodiment is equipped with the alignment coil 22 and the deflecting coil 5, the alignment coil aligning the electron beam within the internal space of the first electrode 3 where the velocity of the electron beam is the highest, and the deflecting coil 5 deflecting the electron beam within the same intra-electrode space. The deflecting coil 5 causes the electron beam 2 to scan two-dimensionally the surface of the sample 6. In this manner, not only the adverse effects of the axial displacement across the lens electrodes are effectively corrected, but the intervening distance is sufficiently shortened between the sample 6 and the electrostatic objective lens comprising the electrodes 3 and 4. The shortening of the above distance is achieved without requiring installation of an additional objective lens under the deflecting coil 5', as is the common practice with the conventional setup. These advantages allow the sixth embodiment to be used with sufficiently reduced lens aberration. The sixth embodiment is also equipped with the stigma coil 24 that provides astigmatism correction within the internal space of the first electrode 3. Thus the embodiment constitutes an electronic optical system for use with a small-sized, simply structured scan type electron microscope with low aberration. Incorporating the sixth embodiment, the scan type electron microscope may illustratively measure as small as 34 mm in tube diameter and 100 mm in height at the most, permitting observation with a resolution as high as 8 nm on an acceleration voltage of 1 kV of the electron beam.

Figure 11:
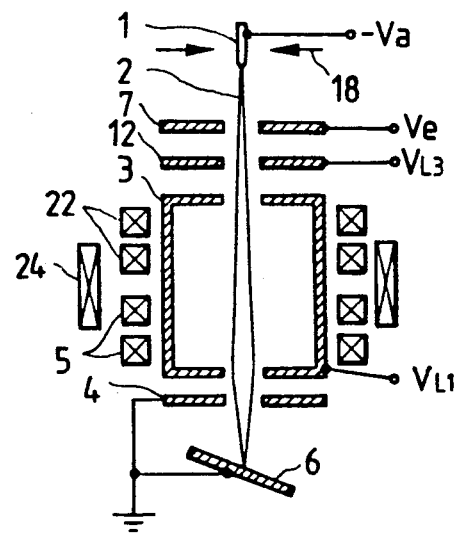
FIG. 11 is a schematic cross-sectional view of a scan type electron microscope practiced as a seventh embodiment of the invention.

FIG. 11 is a schematic cross-sectional view of a scan type electron microscope practiced as the seventh embodiment of the invention. This embodiment has the probe current control electrode 12 additionally installed between the drawing electrode 7 and the first electrode 3 of the embodiment of FIG. 10. The electron beam 2 is focused on the surface of the sample 6 by adjusting the voltage supplied to the probe current control electrode 12 and to the first electrode 3. Adjusting the voltage supply also controls the current value (probe current) of the electron beam irradiated at the sample.

With the above-described embodiments, the alignment coils are compactly constructed using magnetic coils and are located in a vacuum space near the electrodes constituting the electrostatic lens. Alternatively, these magnetic coils may be located outside the vacuum space and still the same benefits are made available thereby.

Another alternative is to dispense with the magnetic coils and to install instead an electrostatic plate within the internal space of the lens electrodes.

Figure 16:
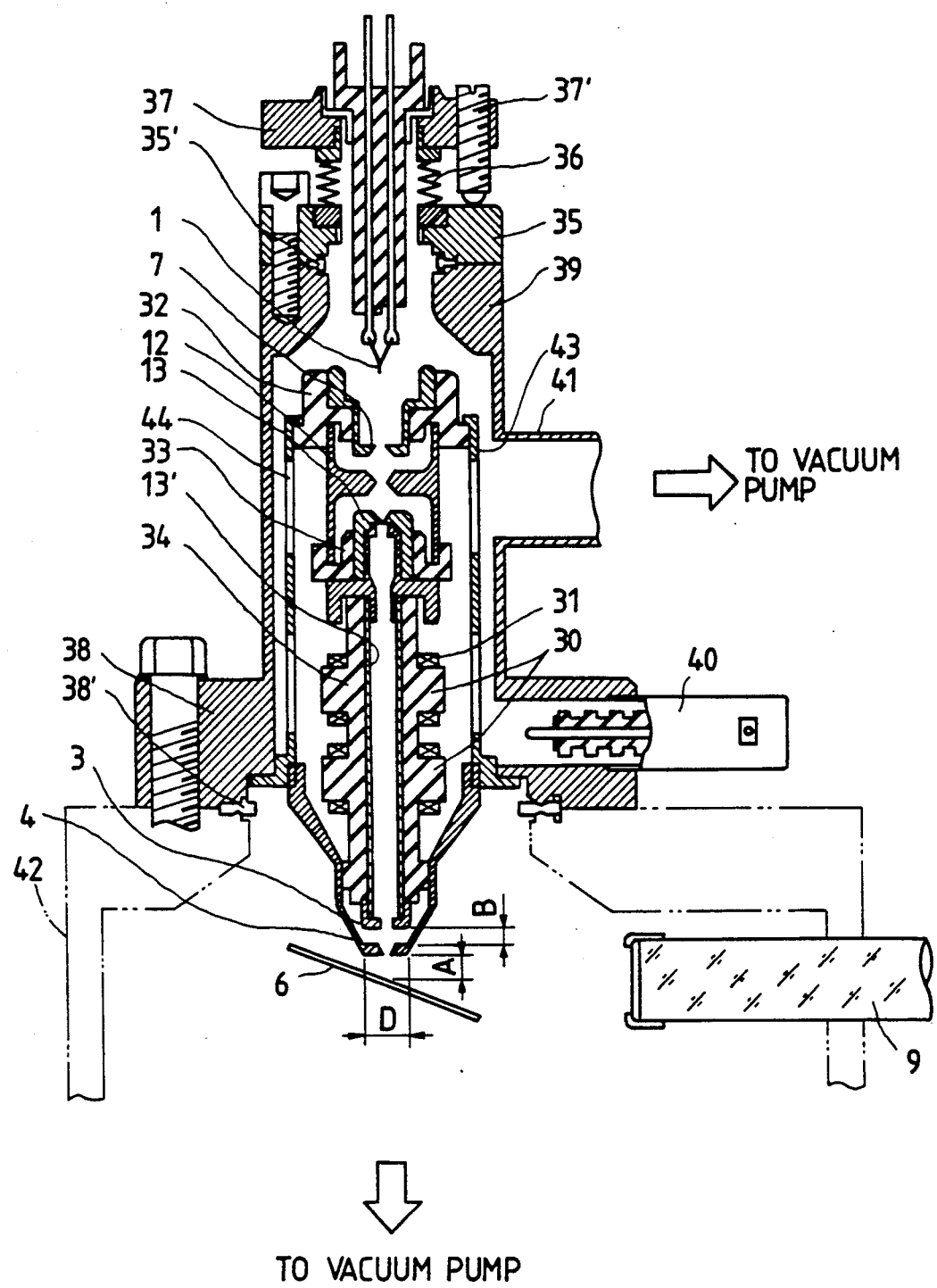
FIG. 16 is a schematic cross-sectional view of a scan type electron microscope practiced as an eighth embodiment of the invention.

FIG. 16 is a schematic cross-sectional view of a scan type electron microscope practiced as the eighth embodiment of the invention. This embodiment is another scan type electron microscope incorporating the electrostatic objective lens described above in detail. The electronic optical system of this microscope has a tube body that measures 34 mm in outer diameter and 120 mm in height. This tube body is a hundredth or less of its prior art counterpart in terms of volume and weight.

How the eighth embodiment works and how it is structured will now be described. An electron beam is emitted from the electron source 1 by application of an electric field between the field emission electron source 1 and the drawing electrode 7. The electron beam is then finely converged by two electric fields of the lenses: one electric field is formed by the drawing electrode 7, control electrode 12 and the third electrode 13 constituting the three-electrode electrostatic lens; the other electric field is generated by the first and second electrodes 3 and 4 making up the electrostatic objective lens according to the invention. The converged electron beam is directed at the sample 6. The electron beam is further converged to a still smaller spot for irradiation at the sample 6 by additional means: the alignment coil 22 of FIG. 11 aligns the electron beam within the space formed by the deflecting space forming electrode 13' whose potential is the same as that of the first and third electrodes 3 and 13; the stigma coil 24 provides astigmatism correction. The finely converged electron beam is deflected by the deflecting coil 5 in the same intra-electrode space, and is made to scan two-dimensionally the surface of the sample 6.

Secondary electrons emanating from the sample 6 as a result of this scan are detected by the secondary electron detector 9. A signal resulting from the secondary electron detection is given as an image signal to a display apparatus that shows a two-dimensional secondary electron image of the surface of the sample. The above-described alignment coil 22, stigma coil 24 and deflecting coil 5 are all wound in layers around a bobbin 30 attached to the circumference of an electrical insulation cylinder 34. In FIG. 16, these coils are represented by a coil 31.

The drawing electrode 7, control electrode 12 and third electrode 13 constituting the three-electrode electrostatic lens are insulated from one another by electrical insulation spacers 32 and 33. The first and second electrodes 3 and 4 are insulated from each other by the electrical insulation cylinder 34. The second electrode 4 and the sample 6 are both connected to ground potential.

Figure 18:
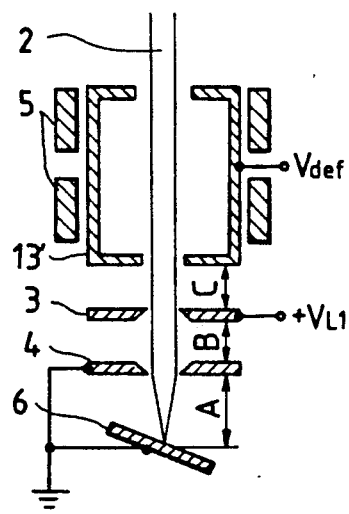
FIG. 18 is a schematic cross-sectional view of a scan type electron microscope practiced as a ninth embodiment of the invention.

The potential of the third electrode 13 and of the deflecting space forming electrode 13' will now be described. In the eighth embodiment, the third electrode 13, the first electrode 3 and the deflecting space forming electrode 13' are all connected to the same potential and are held positive as opposed to the second electrode 4, thereby generating the lens action. Obviously, as shown in FIG. 18, the third electrode 13 and the deflecting space forming electrode 13' may be supplied with a positive potential value different from that applied to the first electrode 3. The reason for applying a positive potential to the third electrode 13 and to the deflecting space forming electrode 13' is this: that if these two electrodes were connected to the same ground potential as that of the second electrode 4, a conventional Einzel lens setup would be constituted. But this Einzel lens setup would not sufficiently reduce the optical aberration involved.

Figure 19:
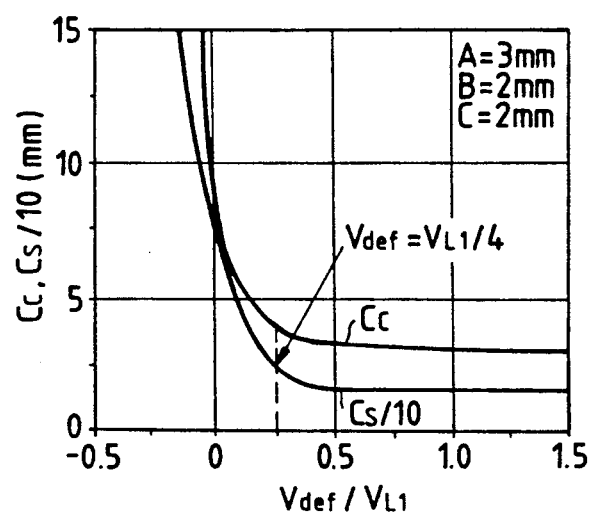
FIG. 19 is a view comparing the electrostatic objective lens according to the invention with the conventional magnetic objective lens in terms of how the aberration coefficient is related to the voltage applied to the electrodes that form a deflecting space.

FIG. 19 shows how the chromatic aberration coefficient Cc and the spheric aberration coefficient Cs vary in the electrostatic objective lens of FIG. 18 when the ratio of one voltage Vdef to another voltage $V_{L1}$ is changed (Vdef/$V_{L1}$), the voltage Vdef being applied to the deflecting space forming electrode 13', and the voltage $V_{L1}$ being fed to the first electrode 3. When a positive potential (Vdef>0) of the same polarity as that of the first electrode 3 is supplied to the deflecting space forming electrode 13', the chromatic aberration coefficient Cc and the spherical aberration coefficient Sc are made smaller than those of the typical Einzel lens (Vdef=0), as illustrated. That is, because of its optical aberration, the abovementioned conventional Einzel lens setup fails to provide a sufficiently converged electron beam spot.

The voltage Vdef should preferably be greater than $V_{L1}/4$ in order to obtain an electrostatic objective lens which provides a sufficiently converged electron beam spot not available with the prior art Einzel lens and which affords at least the same lens performance as that of the magnetic objective lens. When Vdef=$V_{L1}$, as with the ninth embodiment, there is no need to insulate the deflecting space forming electrode 13' from the first electrode 3. With its structure thus simplified, the whole apparatus is manufactured smaller than ever. Another advantage is the absence of the need to carry out bothersome adjustments involved if the deflecting space forming electrode 13' were to bear a different level of potential. A further advantage is a reduced number of high voltage power sources required.

Figure 17A:
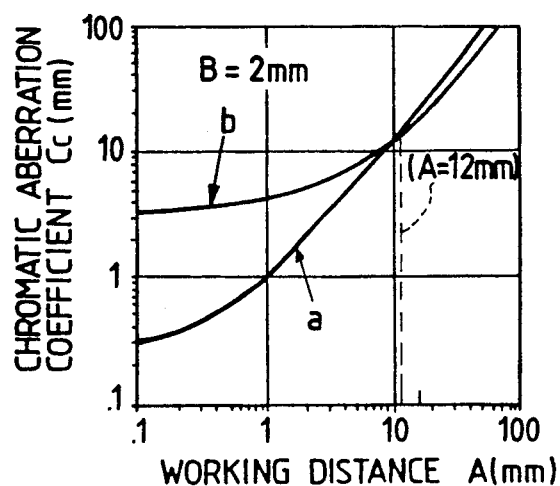
FIG. 17A-B is a set of views graphically comparing the electrostatic objective lens according to the invention with the conventional magnetic objective lens in terms of working distance versus chromatic aberration coefficient.
Figure 17B:
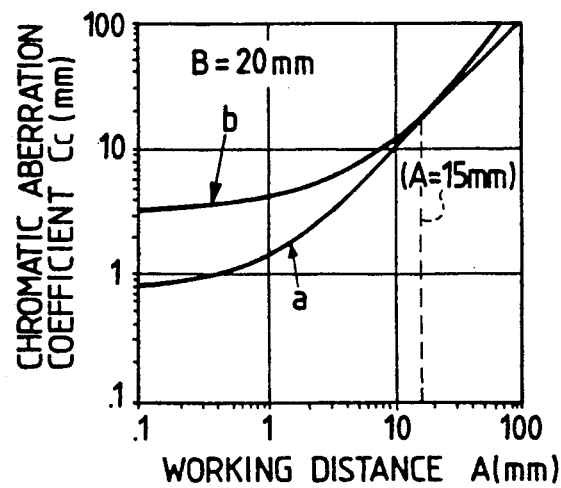

In the ninth embodiment, the working distance A between the sample side bottom of the second electrode 4 and the surface of the sample 6 is approximately from 1 to 10 mm. FIG. 17A–B is a set of views graphically comparing the electrostatic objective lens according to the invention with the representative conventional magnetic objective lens in terms of the working distance A versus the chromatic aberration coefficient Cc, the electrostatic lens being made of the first and second electrodes 3 and 4 (inter-electrode distance B=2 mm and 20 mm), and the magnetic lens having a magnetic pole opening diameter of 4 mm and an inter-pole gap of 4 mm. As shown in FIG. 17, substantially regardless of the inter-electrode distance B, the electrostatic objective lens (plotted by curve a) according to the invention produces lower aberration than the magnetic objective lens (plotted by curve b) when the working distance A is 15 mm or shorter; the electrostatic lens thus permits observation of the sample at higher resolution. In order to attain at least the same resolution as that of the scan type electron microscope that uses the conventional magnetic objective lens, the working distance A should preferably be set for 15 mm or shorter.

As described, the electrostatic objective lens according to the invention provides low-aberration observation through a shortened working distance A substantially regardless of the inter-electrode distance B. It is to be noted that the voltage $V_{L1}$ applied to the first electrode 3, i.e., the voltage needed to converge the electron beam at the working distance A, is progressively raised as the inter-electrode distance B is made longer. The biggest benefit of the ninth embodiment is its structure that makes the tube body of the scan type electron microscope significantly smaller than the prior art. To make the most of this benefit requires keeping the high voltage power supply section and the feed-through arrangement relatively small. Furthermore, it is necessary to install within the narrow space of the tube body the lead wires for supplying a high voltage to the lens electrodes. In this respect, the inter-electrode distance B is preferably minimized so that the voltage to be supplied will be lowered. For example, with the acceleration voltage of 3 kV or lower, the inter-electrode distance B must be less than 20 mm in order to converge the electron beam at a working distance A of 15 mm on a supply voltage of up to 20 kV. While the distance B is to be theoretically less than 20 mm, the ninth embodiment sets this distance for 2 mm to provide for practical allowance. If electrode manufacturing techniques are improved, the inter-electrode distance B may be further shortened so as to make the tube body smaller.

Another advantage of the ninth embodiment is that the principal plane of the electrostatic objective lens exists outside the lens (i.e., on sample side). Thus there is no need to divide the sample into smaller pieces for entry into the lens gap, as is the case with the conventional magnetic objective lens. This means that the surface of a sample with a large area may be observed at sufficiently high resolution outside the lens. In particular, when the sample is a magnetic material, it is impossible to place the sample in the magnetic field within the gap of the conventional magnetic lens.

By contrast, the electrostatic objective lens according to the invention has no magnetic field inside or out of it and thus permits observation of a magnetic sample in its vicinity at sufficiently high resolution. Large samples, such as those of semiconductor wafers, need not be broken into pieces for observation; they can be observed intact at high resolution. Some samples, particularly those of semiconductor wafers, are strongly desired to be observed with their surface at an angle of 45 to 60 degrees to the incidence direction of the eletron beam. In such cases, the second electrode 4 in the lowest position of the electrostatic objective lens may be shaped into a reversed truncated cone with its lower end outer diameter being 10 mm or less.

The electronic optical system of the ninth embodiment utilizes five different potential levels. That is, the electron source 1 bears one potential; the drawing electrode 7 another; the control electrode 12 a third; the third electrode 13, first electrode 3 and deflecting space forming electrode 13' a fourth; and the second electrode 4 a fifth (ground potential). The potential of the electron source 1 determines the acceleration voltage, and the potential of the drawing electrode 7 controls the field emission current from the electron source 1. Adjusting the potential of the control electrode 12 and that of the first electrode 3 controls the value of the probe current to the sample 6 and the focusing status associated therewith. To obtain a high level of resolution along with the lowering of the current value requires that the potential common to the third electrode 13, first electrode 3 and deflecting space forming electrode 13' be set to a positive level 5 to 15 times as high as the ultimate acceleration voltage. This arrangement strongly focuses the electron beam. If it is desired to keep the probe current value higher or to lengthen the focal distance at the expense of a slight drop in resolution, the potential common to the third electrode 13, first electrode 3 and deflecting space forming electrode 13' is lowered so as to reduce the degree of focusing of the electron beam.

As described, the ninth embodiment aims at implementing high resolution by having all its electrodes supplied with potential levels different from the ground potential with the sole exception of the second electrode 4 which is in the lowest position. Under these conditions, the embodiment is also designed to be manufactured smaller. That is, except for the field emission electron source 1, the electrodes 7, 12, 13, 3 and 4 as well as the insulators 32, 33 and 34 are preset so that their center axes are aligned as much as possible through precise fitting of their inner and outer diameters. These electrodes are fixedly supported by a flange 38 via a support cylinder 43 and the second electrode 4 held at the ground potential. The insulators 32, 33 and 34 are made of a ceramic insulation material which has an excellent electrical insulation characteristic and is easy to machine with high precision.

In the ninth embodiment, the bobbin 30 attached to the circumference of the insulation cylinder 34 is wound with a deflecting coil. This deflecting coil is intended to deflect the electron beam 2 in a positive potential space (inside the deflecting space forming electrode 13') above the first electrode 3 (on the electron source side). With the deflecting coil so located as to be insulated from the high voltage section, the scan signal generator of the deflection control system may be connected to ground potential. In order to simplify the apparatus structure, the insulation cylinder 34 doubles as an insulating spacer between the first electrode 3 and the second electrode 4, as described. Furthermore, the electron beam is aligned in the same space in which the above deflection is performed. This is done in order to correct the axial displacement that is bound to occur between the electrodes because of inevitable errors in their machining and assembling precision. The optical alignment of the electron beam is performed as follows: An upper and a lower alignment coil are wound around the bobbin 30, the same bobbin around which the deflecting coil is wound. The bobbin 30 attached to the insulation cylinder 34 is also wound with a stigma coil that provides astigmatism correction using the same space as that for the above deflection. In this manner, where it is desired to make the electronic optical system smaller, the deflecting coil, alignment coils and stigma coil should preferably be wound in layers around the same or common bobbin. In FIG. 16, the coil 31 represents those coils wound in layers.

Prior to its use, the tube body of the ninth embodiment is subjected to baking so that the degree of vacuum inside will be enhanced. To withstand baking, the deflecting coil, alignment coil and stigma coil are all made of heat-resistant wires (e.g., polyimide-clad wires that withstand 200° C. or more). To simplify the apparatus structure, these heat-resistant wires are not sealed and are exposed to the vacuum.

The ninth embodiment electromagnetically provides the functions of deflection, alignment and astigmatism correction using electromagnetic coils. Alternatively, these functions may be implemented electrostatically by installing an electrode arrangement inside the deflecting space forming electrode 13'. In such a case, however, the voltage source for each electrode needs to be raised in voltage level commensurate with the voltage of the deflecting space forming electrode 13'.

To achieve high resolution, the ninth embodiment employs as its electron source 1 a cold cathode field emission type electron source that has a small light source diameter and provides a narrow electron energy width. For use with analyzing instruments such as an Auger electron spectroscope or an electron beam tester, the embodiment should preferably utilize a hot cathode field emission type electron source that provides larger probe currents. If it is impossible to keep the vicinity of the electron source 1 in an ultra-high vacuum state, a conventional hot electron source needs to be used. However, this arrangement requires sacrificing the level of resolution to a certain extent.

The field emission type electron source 1 needs to be optically aligned with the above-mentioned electrostatic objective lens that is preset. In the ninth embodiment, the feed-through arrangement supporting the electron source 1 is directly attached to a support member 37 for size reduction purposes. The support member 37 is attached to a flange 35 in a finely adjustable manner (in horizontal, vertical and tilting directions) through a moving mechanism comprising a bellows 36 and an adjusting screw 37'. The flange 35 is secured via a gasket 35' to the upper end of a tube body 39 and has the smallest ICF-compatible outer diameter (34 mm). This arrangement makes it possible to adjust optimally the electron source position from outside the vacuum with respect to the electrostatic lens setup.

In order to stabilize the flow of electrons from the field emission type electron source 1, it is desirable to cover the surface of the drawing electrode 7 with a coat of a stable metal that ensures minimum gas emissions upon electron impact. In the ninth embodiment, gold is vacuum deposited on the electron source side surface of the drawing electrode 7. Preferably, a heater should be embedded in the insulator 32 to raise the heating temperature of the drawing electrode 7 for sufficient degassing.

The electrodes ranging from the drawing electrode 7 to the second electrode 4 are combined via the support cylinder 43 into a preset assembly. This assembly and the electron source 1 are integrally attached to the tube body 39. The integral attachment permits fastening, to diverse kinds of sample chambers 42, of the very small electron optical system ranging from the electron source 1 to the second electrode 4 in the scan type electron microscope. In order to remove adverse effects of an external electrical field onto the electron beam and to obtain the finely converged spot thereof, at least either the tube body 39 or the support cylinder 43 should preferably be made of a magnetic material.

High voltage lead-in terminals and current lead-in terminals 40 are provided on the side of the tube body 49. This involves the use of a gasket 38' which is greater in diameter than the gasket 35' for the flange 35 on the side of the electron source 1. The gasket 38' permits easy coupling of various kinds of sample chambers 42 with of other analyzing instruments. To ensure compatibility with an instrument whose sample chamber 42 is not operated in an ultra-high vacuum requires performing differential evacuation across the vicinity of the electron source 1 to the sample chamber 42.

With the ninth embodiment, no electrode except for the second electrode 4 is connected to ground potential. Therefore, differential evacuation is carried out in the sample chamber and on the side of the field emission type electron source, both requiring an ultra-high vacuum state. The boundary between these two sides is the second electrode 4 at ground potential, the portion that attaches the electrode 4 to the tube body, or both sides of the insulators 32, 33 and 34. In such a case, the electron source side is made vacuum through a vent hole on the side wall of the tube body. A large opening 44 is provided on the side wall of the support cylinder 43 in the lens setup. This opening is intended to enhance the degree of vacuum within the lens setup.

The fact that the whole tube body is smaller by two orders of magnitude in volume than its prior art counterpart offers one distinctive advantage. That is, with the sample chamber 42 in an ultra-high vacuum, using that vacuum state affords the tube body a sufficiently high degree of vacuum without equipping the latter with its own evacuation system.

With the scan type electron microscope practiced as the ninth embodiment of the invention, setting the working distance A for 2 mm implements a resolution level of as high as 6 nm on a low acceleration voltage of 1 kV. This performance significantly surpasses the resolution (up to 10 nm) of a large-scale scan type electron microscope that uses the conventional magnetic objective lens (with the sample placed outside the lens).

While preferred embodiments of the invention have been described using specific terms, such description is for illustrative purposes only, and it is to be understood that changes and variations may be made without departing from the spirit or scope of the appended claims. For example, although the invention has been described in terms of application to the scan type electron microscope, it is also possible to apply the invention to other electron beam apparatuses such as an electron beam measuring apparatus and an electron beam drawing apparatus. Simple variations, such as changed polarity of the supplied voltage, allow the invention to be readily applied to ion microscopes, converged ion beam apparatuses, secondary ion mass spectrometers and other converged ion beam devices. It is intended that the invention embrace all such variations and alternatives.

As described and according to the invention, an electrostatic objective lens setup comprising two electrodes positions the principal plane of the lens outside the two component electrodes (i.e., under the lower electrode). This setup permits observation of the sample without having to place it inside the space of the lens at a significantly reduced level of lens aberration. One benefit of this objective lens setup is that large area samples such as those of semiconductor wafers may be observed nondestructively at high resolution under the scan type electron microscope. Another benefit is that its very simple structure makes the objective lens setup highly conducive to manufacture in small size. Because a sufficiently wide space is ensured between the lower plane of the objective lens and the sample while high resolution is maintained, the apparatus is amenable to coupling with other observing or measuring instruments such as a scan type tunnel microscope for complex and expanded observation or measurement. Also according to the invention, the electron beam is deflected in the space with the same polarity or potential as that of the electrode on the electron source side in the above two-electrode electrostatic objective lens setup. This allows the whole apparatus to be structured more compactly than ever without sacrificing its resolution.

As described and further according to the invention, the charged particle beam is aligned by electrical means inside the space of the electrodes constituting the electrostatic lens setup. This makes it possible to correct the axial displacement precisely across the electrodes making up the electrostatic lens setup, which in turn reduces the optical aberration involved more effectively than ever. Unlike the conventional mechanical alignment means, the electrical alignment means allows the electronic optical system to be small and quite simple in structure. Further according to the invention, the electron beam is deflected within the same space in which the above alignment is performed, and astigmatism correction is also carried out in the same space. This feature allows the electronic optical system to be made smaller without increasing the optical aberration in the charged particle beam apparatus.

What is claimed is:

1. A charged particle beam apparatus, comprising:
    a charged particle beam generating means for generating a charged particle beam; and
    a charged particle beam converging means, including at least an objective lens, for converging said charged particle beam on a sample;
    wherein said objective lens is an electrostatic objective lens having a first and a second electrode operably positioned opposite to each other and having respective openings through which said charged particle beam passes;
    said first electrode and said second electrode are relatively located close to said charged particle source and to said sample, respectively;
    said first electrode is supplied with a more positive potential than that supplied to said second electrode when said charged particle beam is a negatively charged particle beam;
    said first electrode is supplied with a more negative potential than that supplied to said second electrode when said charged particle beam is a positively charged particle beam; and
    the principal plane of said electrostatic objective lens is located between said second electrode and said sample.

2. A charged particle beam apparatus comprising:
    a charged particle beam generating means for causing a charged particle source to generate a charged particle beam;
    a charged particle beam converging means, including at least an objective lens, for converging said charged particle beam on a sample; and
    a charged particle beam deflecting means for causing said charged particle beam to scan the surface of said sample;
    wherein said objective lens is an electrostatic objective lens having a first and a second electrode operably positioned opposite to each other and having respective openings through which said charged particle beam passes;
    said first electrode and said second electrode are relatively located close to said charged particle source and to said sample, respectively;
    said first electrode is supplied with a more positive potential than that supplied to said second electrode when said charged particle beam is a negatively charged particle beam;
    said first electrode is supplied with a more negative potential than that supplied to said second electrode when said charged particle beam is a positively charged particle beam; and
    said charged particle beam deflecting means deflects said charged particle beam in a beam deflecting space having a potential that is of the same polarity as that of said first electrode relative to that of said second electrode.

3. A charged particle beam apparatus according to claim 2, further comprising a deflecting space forming electrode between said charged particle source and said first electrode, and close to said first electrode, for enclosing the beam deflecting space;
    wherein said deflecting space forming electrode has a potential whose polarity is the same as that of said first electrode relative to that of said second electrode.

4. A charged particle beam apparatus according to claim 3, further comprising an electromagnetic alignment means for aligning the optical axis of said charged particle beam within the beam deflecting space.

5. A charged particle beam apparatus according to claim 4, further comprising an electromagnetic astigmatism correction means for performing astigmatism correction of said electrostatic lens within the beam deflecting space.

6. A charged particle beam apparatus according to claim 4, further comprising an electrostatic astigmatism correction means for performing astigmatism correction of said electrostatic lens within the beam deflecting space.

7. A charged particle beam apparatus according to claim 3, further comprising an electrostatic alignment means for aligning the optical axis of said charged particle beam within the beam deflecting space.

8. A charged particle beam apparatus according to claim 7, further comprising an electromagnetic astigmatism correction means for performing astigmatism correction of said electrostatic lens within the beam deflecting space.

9. A charged particle beam apparatus according to claim 7, further comprising an electrostatic astigmatism correction means for performing astigmatism correction of said electrostatic lens within the beam deflecting space.

10. A charged particle beam apparatus according to claim 3, further comprising an electromagnetic astigmatism correction means for performing astigmatism correction of said electrostatic lens within the beam deflecting space.

11. A charged particle beam apparatus according to claim 3, further comprising an electrostatic astigmatism correction means for performing astigmatism correction of said electrostatic lens within the beam deflecting space.

12. A charged particle beam apparatus according to claim 2, further comprising an electromagnetic alignment means for aligning the optical axis of said charged particle beam within the beam deflecting space.

13. A charged particle beam apparatus according to claim 12, further comprising an electromagnetic astigmatism correction means for performing astigmatism correction of said electrostatic lens within the beam deflecting space.

14. A charged particle beam apparatus according to claim 12, further comprising an electrostatic astigmatism correction means for performing astigmatism correction of said electrostatic lens within the beam deflecting space.

15. A charged particle beam apparatus according to claim 2, further comprising an electrostatic alignment means for aligning the optical axis of said charged particle beam within the beam deflecting space.

16. A charged particle beam apparatus according to claim 15, further comprising an electromagnetic astigmatism correction means for performing astigmatism correction of said electrostatic lens within the beam deflecting space.

17. A charged particle beam apparatus according to claim 15, further comprising an electrostatic astigmatism correction means for performing astigmatism correction of said electrostatic lens within the beam deflecting space.

18. A charged particle beam apparatus according to claim 2, further comprising an electromagnetic astigmatism correction means for performing astigmatism correction of said electrostatic lens within the beam deflecting space.

19. A charged particle beam apparatus according to claim 2, further comprising an electrostatic astigmatism correction means for performing astigmatism correction of said electrostatic lens within the beam deflecting space.

20. A charged particle beam apparatus according to claim 2, wherein said charged particle source is a field emission type electron source;
said field emission type electron source and said charged particle beam deflecting means form the beam deflecting space therebetween, said charged particle beam deflecting means deflecting an electron beam emitted by said electron source within said beam deflecting space; and
further comprising a drawing electrode between said electron source and said beam deflecting space, said drawing electrode being supplied with a drawing voltage which causes field emission of said electron beam from said electron source.

21. A charged particle beam apparatus according to claim 22, further comprising a probe current control electrode for controlling the probe current of the charged particle beam irradiated at the sample surface, said probe current control electrode being located between said drawing electrode and said beam deflecting space.

22. A charged particle beam apparatus, comprising:
a charged particle beam generating means for causing a charged particle source to generate a charged particle beam;
a charged particle beam converging means containing at least an objective lens, for converging said charged particle beam on a sample; and
a charged particle beam deflecting means for causing said charged particle beam to scan the surface of said sample;
wherein said objective lens is an electrostatic objective lens having a first and a second electrode operably positioned opposite to each other and having respective openings through which said charged particle beam passes;
said first electrode and said second electrode are relatively located close to said charged particle source and to said sample, respectively;
said first electrode is supplied with a more positive potential then that supplied to said second electrode when said charged particle beam is a negatively charged particle beam;
said first electrode is supplied with a more negative potential than that supplied to said electrode when said charged particle beam is a positively charged particle beam; and
said charged particle beam deflecting means deflects said charged particle beam in a beam deflecting space whose potential is the same as that of said first electrode.

23. A charged particle beam apparatus according to claim 22, wherein said first electrode is arranged to enclose the beam deflecting space.

24. A charged particle beam apparatus according to claim 22, further comprising a deflecting space forming electrode between said charged particle source and said first electrode, and close to said first electrode, for providing the beam deflecting space;
wherein said deflecting space forming electrode has a potential whose polarity is the same as that of said first electrode; and
said deflecting space forming electrode is arranged to enclose the beam deflecting space.

25. A charge particle beam apparatus according to claim 22, wherein said charged particle source is a field emission type electron source;
said field emission type electron source and said charged particle beam deflecting means form the beam deflecting space therebetween, said charged particle beam deflecting means deflecting an electron beam emitted by said electron source within said beam deflecting space; and
further comprising a drawing electrode between said electron source and said beam deflecting space, said drawing electrode being supplied with a drawing voltage which causes field emission of said electron beam from said electron source.

26. A charged particle beam apparatus according to claim 25, further comprising a probe current control electrode for controlling the probe current of the charged particle beam irradiated at the sample surface, said probe current control electrode being located between said drawing electrode and said beam deflecting space.

27. A charged particle beam apparatus according to claim 22, further comprising an electromagnetic alignment means for aligning the optical axis of said charged particle beam within the beam deflecting space.

28. A charged particle beam apparatus according to claim 22, further comprising an electrostatic alignment means for aligning the optical axis of said charged particle beam within the beam deflecting space.

29. A charged particle beam apparatus according to claim 22, further comprising an electromagnetic astigmatism correction means for performing astigmatism correction of said electrostatic lens within the beam deflecting space.

30. A charged particle beam apparatus according to claim 22, further comprising an electrostatic astigmatism correction means for performing astigmatism correction of said electrostatic lens within the beam deflecting space.

31. A charged particle beam apparatus, comprising:
a charged particle beam generating means for causing a charged particle source to generate a charged particle beam;
a charged particle beam converging means for converging said charged particle beam on a sample; and
an alignment means for aligning the optical axis of said charged particle beam;
wherein said charged particle beam converging means includes an electrostatic lens having at least two electrodes; and
said alignment means aligns the optical axis of said charged particle beam with respect to the optical axis of the electrostatic lens within an internal space defined by one of the electrodes of said electrostatic lens, said electrode being supplied with a potential which is different from ground potential.

32. A charged particle beam apparatus according to claim 31, wherein said electrode that defines the internal space is supplied with a potential which maximizes the velocity of said charged particle beam.

33. A charge particle beam apparatus according to claim 31, further comprising a charged particle deflecting means for deflecting said charged particle beam for two-dimensional scanning of said sample, said deflecting being carried out within the space in which said alignment means aligns the optical axis of said charged particle beam.

34. A charged particle beam apparatus according to claim 33, wherein said charged particle beam deflecting means is an electromagnetic charged particle beam deflecting means.

35. A charged particle beam apparatus according to claim 33, wherein said charged particle beam deflecting means is an electrostatic charged particle beam deflecting means.

36. A charged particle beam apparatus according to claim 31, further comprising an astigmatism correction means for performing astigmatism correction of said electrostatic lens within the space in which said alignment means aligns the optical axis of said charged particle beam.

37. A charged particle beam apparatus according to claim 36, wherein the astigmatism correction means is an electromagnetic astigmatism correction means.

38. A charged particle beam apparatus according to claim 36, wherein the astigmatism correction means is an electrostatic astigmatism correction means.

39. A charged particle beam apparatus according to claim 31, wherein said alignment means is an electromagnetic alignment means.

40. A charged particle beam apparatus according to claim 31, wherein said alignment means is an electrostatic alignment means.

41. A charged particle beam apparatus, comprising:
a charged particle beam generating means for causing a charged particle source to generate a charged particle beam;
a charged particle beam converging means for converging said charged particle beam on a sample; and
an alignment means for aligning the optical axis of said charged particle beam;
wherein said charged particle beam converging means includes a combination of an electrostatic lens having at least two electrodes and a magnetic lens; and
said alignment means aligns the optical axis of said charged particle beam with respect to the optical axis of the electrostatic lens within an internal space defined by one of the electrodes of said electrostatic lens, said electrode being supplied with a potential which is different from ground potential.

42. A charged particle beam apparatus according to claim 41, wherein said electrode that defines the internal space is supplied with a potential which maximizes the velocity of said charged particle beam.

43. A charged particle beam apparatus according to claim 41, further comprising a charged particle deflecting means for deflecting said charged particle beam for two-dimensional scanning of said sample, said deflecting being carried out within the space in which said alignment means aligns the optical axis of said charged particle beam.

44. A charged particle beam apparatus according to claim 43, wherein said charged particle beam deflecting means is an electromagnetic charged particle beam deflecting means.

45. A charged particle beam apparatus according to claim 43, wherein said charged particle beam deflecting means is an electrostatic charged particle beam deflecting means.

46. A charged particle beam apparatus according to claim 41, wherein said alignment means is an electromagnetic alignment means.

47. A charged particle beam apparatus according to claim 41, wherein said alignment means is an electrostatic alignment means.

48. A charged particle beam apparatus according to claim 40, further comprising an astigmatism correction means for performing astigmatism correction of said electrostatic lens within the space in which said alignment means aligns the optical axis of said charged particle beam.

49. A charged particle beam apparatus according to claim 48, wherein the astigmatism correction means is an electromagnetic astigmatism correction means.

50. A charged particle beam apparatus according to claim 48, wherein the astigmatism correction means is an electrostatic astigmatism correction means.

* * * * *